United States Patent
Sun et al.

(10) Patent No.: US 12,021,369 B2
(45) Date of Patent: Jun. 25, 2024

(54) IMPULSE VOLTAGE GENERATION DEVICE, AND POWER SEMICONDUCTOR SWITCH PROTECTION METHOD

(71) Applicant: TMEIC CORPORATION, Tokyo (JP)

(72) Inventors: Jintong Sun, Tokyo (JP); Tetsuo Yoshimitsu, Tokyo (JP); Hirotsugu Tsutsui, Tokyo (JP); Kiyoshi Umezu, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 913 days.

(21) Appl. No.: 16/931,448

(22) Filed: Jul. 17, 2020

(65) Prior Publication Data

US 2020/0350756 A1 Nov. 5, 2020

Related U.S. Application Data

(63) Continuation of application No. PCT/JP2019/006144, filed on Feb. 19, 2019.

(51) Int. Cl.
*H02H 3/00* (2006.01)
*H02H 3/08* (2006.01)
(Continued)

(52) U.S. Cl.
CPC .............. *H02H 3/08* (2013.01); *H03K 5/00* (2013.01); *H03K 19/20* (2013.01); *H03M 1/124* (2013.01); *H03K 2005/00026* (2013.01)

(58) Field of Classification Search
CPC ............ H02H 3/08; H03K 5/00; H03K 19/20; H03K 2005/00026; G01R 19/16571; H03M 1/124

(Continued)

(56) References Cited

U.S. PATENT DOCUMENTS 3,659,087 A 4/1972 Green et al.
4,733,102 A 3/1988 Nakayama et al.
(Continued)

FOREIGN PATENT DOCUMENTS

AU 6031586 A 8/1987
CN 86105757 A 9/1987
(Continued)

OTHER PUBLICATIONS

Chinese Office Action dated Aug. 24, 2022 in corresponding Chinese Patent Application No. 201980009939.5 (Previously filed; submitting English translation only).
(Continued)

*Primary Examiner* — Jared Fureman
*Assistant Examiner* — Lucy M Thomas
(74) *Attorney, Agent, or Firm* — XSENSUS LLP

(57) ABSTRACT

An impulse voltage generation device comprises: a high voltage generator to generate high DC voltage; a capacitor that is disposed in parallel to the high voltage generator and can be charged to a high voltage state; a power semiconductor switch that is placed at an output side of the high voltage generator and in series to the high voltage generator and is designed to shut off or allow electricity output from the high voltage generator; a function generator to output changes over time of impulse voltage to be applied to the test target; a current detector to detect output current; and an overcurrent protection circuit that is configured to conduct analog-to-digital conversion at sampling intervals sufficiently shorter than the application intervals when receiving a current signal from the current detector, monitors values of the output current, and to block output from the function generator to the power semiconductor switch if it is determined that there is an abnormality.

14 Claims, 9 Drawing Sheets

(51) Int. Cl.
 *H03K 5/00* (2006.01)
 *H03K 19/20* (2006.01)
 *H03M 1/12* (2006.01)

(58) Field of Classification Search
 USPC .......................................................... 361/87
 See application file for complete search history.

(56) References Cited

U.S. PATENT DOCUMENTS

| | | | |
|---|---|---|---|
| 5,973,473 A * | 10/1999 | Anderson | H02P 1/42 |
| | | | 318/788 |
| 6,369,460 B1 * | 4/2002 | Endoh | H02J 7/0031 |
| | | | 320/132 |
| 6,594,129 B1 * | 7/2003 | Baba | H03K 17/0822 |
| | | | 361/87 |
| 2003/0206021 A1 | 11/2003 | Laletin et al. | |
| 2004/0047097 A1 | 3/2004 | Thomas Jordan et al. | |
| 2009/0066391 A1 | 3/2009 | Tao et al. | |
| 2009/0273498 A1 | 11/2009 | Goder et al. | |
| 2010/0208502 A1 | 8/2010 | Horii | |
| 2011/0019452 A1 | 1/2011 | Shinomoto et al. | |
| 2011/0317315 A1 | 12/2011 | Motohashi et al. | |
| 2012/0223596 A1 | 9/2012 | Miura | |
| 2014/0292382 A1 | 10/2014 | Ogawa et al. | |
| 2015/0015303 A1 | 1/2015 | Sakurai et al. | |
| 2016/0241134 A1 | 8/2016 | Maruyama | |

FOREIGN PATENT DOCUMENTS

| | | | |
|---|---|---|---|
| CN | 1466255 | A | 1/2004 |
| CN | 101183785 | A | 5/2008 |
| CN | 101453174 | A | 6/2009 |
| CN | 101790836 | A | 7/2010 |
| CN | 101834523 | A | 9/2010 |
| CN | 102130591 | A | 7/2011 |
| CN | 102142699 | A | 8/2011 |
| CN | 102299507 | A | 12/2011 |
| CN | 102668357 | A | 9/2012 |
| CN | 103999347 | A | 8/2014 |
| CN | 104169730 | A | 11/2014 |
| CN | 104267271 | A | 1/2015 |
| CN | 206248733 | U | 6/2016 |
| CN | 106452159 | A | 2/2017 |
| CN | 106569115 | A | 4/2017 |
| CN | 207992388 | U | 10/2018 |
| DE | 102005024030 | A1 | 12/2006 |
| EP | 0011899 | A1 | 6/1980 |
| JP | H06-148296 | A | 5/1994 |
| JP | 2005-304102 | A | 10/2005 |
| JP | 2006-234484 | A | 9/2006 |
| JP | 2006-275831 | A | 10/2006 |
| JP | 2011-250671 | A | 12/2011 |
| JP | 5998548 | B2 | 9/2016 |
| KR | 870006929 | A | 8/1987 |
| SU | 559378 | A1 | 5/1977 |
| WO | 2013/094189 | A1 | 6/2013 |

OTHER PUBLICATIONS

Chinese Office Action dated Aug. 24, 2022 in corresponding Chinese Patent Application No. 201980009939.5, 13 pages.
Maeyama et al., "Improvement of a High Repetitive Rate Static Impulse Voltage Generator", IEEE Conference Record, Aug. 7, 2002, pp. 1264-1267.
See et al., "Measurement of space-charge distributions in solid insulators under rapidly varying voltage using the high-voltage, high-speed pulsed electro-acoustic (PEA) apparatus", Measurement Science and Technology vol. 12 No. 8, pp. 1227-1234.
Wang et al., "Overvoltage Suppression of High Voltage Pulse Circuits Based on Semiconductor Switches and Pulse Transformers", Journal of Integration Technology, vol. 7 No. 4, Jul. 2018, pp. 24-34 (with English Abstract and partial English translation).
Extended European search report dated Nov. 30, 2020, in corresponding European patent Application No. 19906592.1, 9 pages.
International Search Report and Written Opinion dated May 14, 2019 for PCT/JP2019/006144 filed on Feb. 19, 2019, 5 pages.
Office Action dated Jun. 24, 2021, in corresponding Indian patent Application No. 202017028472, 6 pages.
Japanese Notification of Reasons for Refusal dated Nov. 29, 2022 in Japanese Patent Application No. 2019-551411 (with machine-generated English translation), 16 pages.

* cited by examiner

IMPULSE VOLTAGE GENERATION DEVICE, AND POWER SEMICONDUCTOR SWITCH PROTECTION METHOD

CROSS-REFERENCE TO RELATED APPLICATION

The present application is a bypass continuation of International Application No. PCT/JP2019/006144, filed on Feb. 19, 2019, the entire content of which is incorporated herein by reference.

FIELD

The invention relates to an impulse voltage generation device, and a power semiconductor switch protection method.

BACKGROUND

An impulse voltage generation device is, for example, applied to an inverter driven system including a motor, an inverter and cables. The inverter of the inverter driven system converts a DC voltage into a pulse voltage through switching operation, and supplies the pulse voltage to the motor via the cable. The motor is driven by the pulse voltage.

However, in the inverter driven system, due to impedance mismatching between the inverter, the cables and the motor, reflected waves are generated. The reflected waves are superimposed on the pulse voltage, leading to a possibility of having high voltage noise generated between the cable and the motor, especially in the connection portion of the cable and the motor. In this case, the high voltage noise is referred to as inverter surge, so that it is differentiated from lightning surges.

As one type of test designed to evaluate an inverter driven system, there is known a test in which simulated inverter surges are generated and applied to the connection portion as a load as shown in Japanese Patent No. 5998548. In particular, there is known a test in which the following periods appear alternately: the period during which impulse voltage is repeatedly generated as simulated inverter surges and applied to the load, and the period during which there is no impulse voltage generated. In order to carry out this test, an impulse voltage generation device that utilizes discharge gaps is used.

Confirmation tests of the latest IEC standard require a repetitive impulse power supply of several kilohertz with voltage of several kilovolt. According to the prior art, in order to generate repetitive impulses, plasma ball gaps has been used. Malfunctions rarely occur with the ball gaps, but the problem is that it is difficult to generate the same waveforms at regular intervals with accuracy.

According to a proposed method, in order to generate repetitive impulses with precision, power semiconductor switches are incorporated. For example, a power semiconductor switch is between the power supply and an inverter, with a protection discharge circuit placed in parallel (Patent Document 1).

Typically, on the power supply side, a protection circuit such as a overcurrent relay is installed. Moreover, if abnormal current were to flow, a power supply device is generally designed to carry out protective actions, including suppressing output voltage.

However, in a circuit of the above-described impulse voltage generation device, an impulse voltage to be applied to the load side is generated by discharge from capacitors. The impulse voltage is virtually not affected by the situation on the power supply device side. Therefore, the protective actions of the power supply side have no effects on overcurrent flowing through power semiconductor switches.

DETAILED DESCRIPTION

Figure 1:
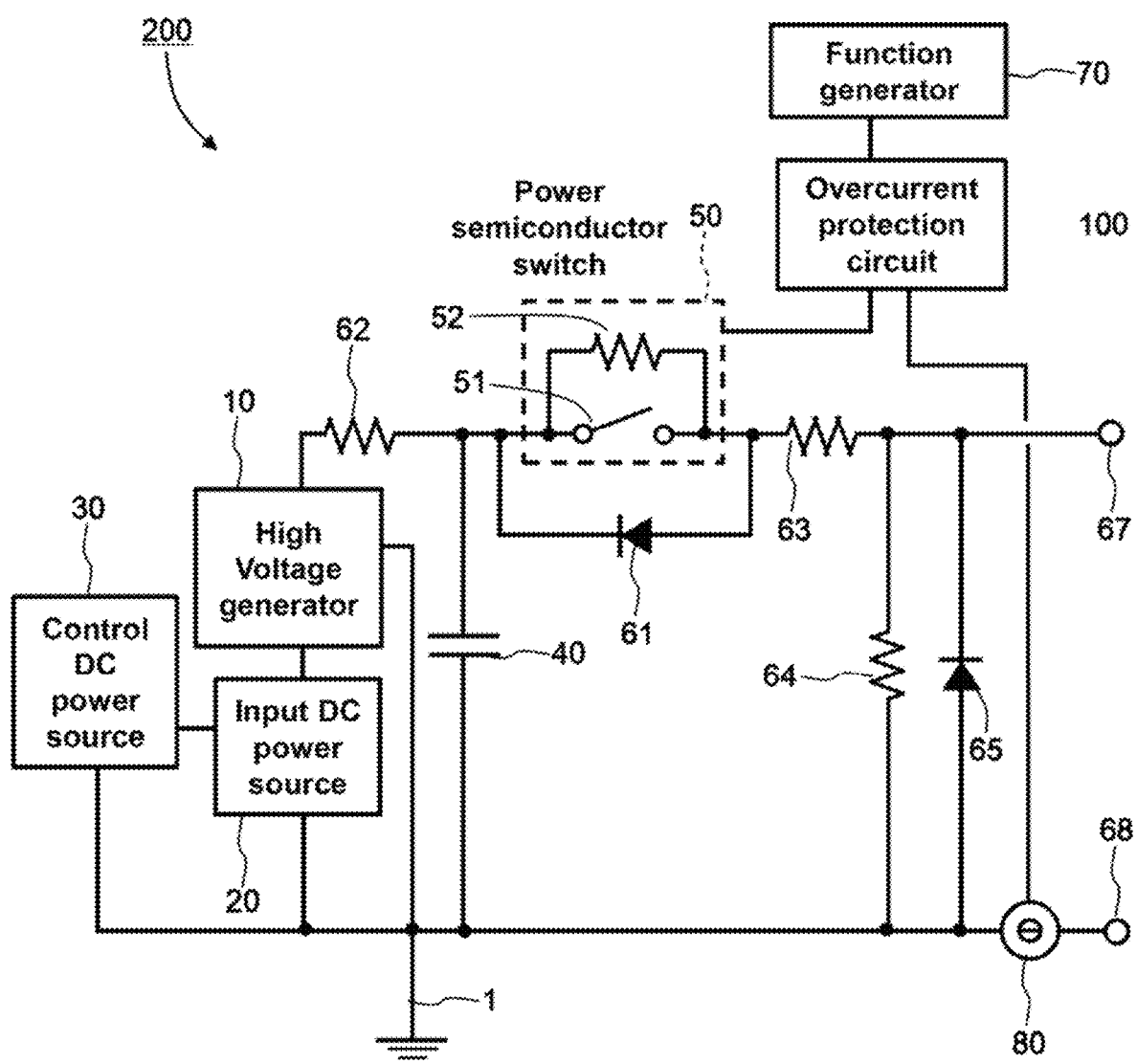
FIG. 1 is a block diagram showing the configuration of an impulse voltage generation device according to a first embodiment.

An object of the present invention is to avoid a situation resulting in malfunctioning of power semiconductor switches in an impulse voltage generation device.

According to an aspect of the present invention, there is provided an impulse voltage generation device designed to output impulse voltage from an output terminal in order to repeatedly apply impulse voltage to a test target at predetermined application intervals, the device comprising: an input DC power source to supply DC power; a high voltage generator to generate DC voltage higher than voltage of the input DC power source; a capacitor that is disposed in parallel to the high voltage generator and can be charged to a high voltage state; a power semiconductor switch that is placed at an output side of the high voltage generator and in series to the high voltage generator and is designed to shut off or allow electricity output from the high voltage generator; a function generator to output, to the power semiconductor switch, changes over time of impulse voltage to be applied to the test target; a current detector to detect output current at the output terminal; and an overcurrent protection circuit that is configured to conduct analog-to-digital conversion at sampling intervals sufficiently shorter than the application intervals when receiving a current signal from the current detector, monitors values of the output current, and to block output from the function generator to the power semiconductor switch if it is determined that there is an abnormality.

According to an aspect of the present invention, there is provided a method for protecting a power semiconductor switch that repeatedly applies an impulse voltage to a test target at predetermined application intervals, the method comprising: an application step of causing an impulse voltage to be applied to a test target due to an output from a function generator; a current value reading step of allowing the logic operation and judgment portion to read a current value; a judgment step of enabling the logic operation and judgment portion to determine whether a current value that is read is greater than or equal to a specified value, and, if the current value is not greater than or equal to the specified value, conducting the current value reading step and subsequent processes repeatedly; and a block step of operating a trigger signal block circuit if the logic operation and judgment portion determines that a current value that is read is greater than or equal to the specified value.

Hereinafter, an impulse voltage generation device, a power semiconductor switch protection method according to embodiments of the present invention will be described with reference to the accompanying drawings. The same reference numerals are given to the same or similar parts, and repeated description will be omitted.

First Embodiment

FIG. 1 is a block diagram showing the configuration of an impulse voltage generation device according to a first embodiment. The impulse voltage generation device 200 includes a high voltage generator 10, an input DC power source 20, a control DC power source 30, a capacitor 40, a power semiconductor switch 50, a function generator 70, and an overcurrent protection circuit 100.

The input DC power source 20 is a DC power supply at around the level of 10V. The high voltage generator 10 amplifies and multiplies the voltage of the input DC power source 20 by the order of $10^3$, such as 3,000, in order to generate a high voltage up to several kilovolts. The high voltage generated by the high voltage generator 10 can be obtained, for example, by converting the voltage of the input DC power source 20 into alternating current and boosting it to a DC high voltage by the means such as Cockcroft-Walton system.

The control DC power source 30 outputs to the input DC power source 20 as a control signal which specifies the time when the voltage value of DC voltage rises and the time when the value falls. For example, such operations as outputting a predetermined voltage for 2 seconds and then setting it at zero for the 2-second period that follows are repeated. In this manner, the overall pattern of voltage application in a test is controlled.

The capacitor 40 has a capacity of several nanofarads, for example. A charge resistance element 62 is a resistance element on the entrance side of the capacitor 40. The low voltage sides of the input DC power source 20, the high voltage generator 10 and the capacitor 40 are connected to the earth 1.

The power semiconductor switch 50 is conceptually shown as having a switch portion 51 and a protection resistance element 52. The power semiconductor switch 50 is repeatedly switched on and off at frequency of several kilohertz. In parallel to the power semiconductor switch 50, a switch reverse voltage protection diode 61 is installed to protect the power semiconductor switch 50 against reverse voltage.

On the side that is closer to the load than the power semiconductor switch 50, an adjustment resistance element 63 and a load side resistance element 64 are series-connected to earth potential. An output terminal 67, which is connected to a target to be supplied with impulse voltage, extends from a connection point of the adjustment resistance element 63 and the load side resistance element 64. An output terminal 68 is at earth potential. In parallel to the load side resistance element 64, a load reverse voltage protection diode 65 is installed to protect the impulse voltage generation device 200 against reverse voltage.

At the gate portion (not shown) of the power semiconductor switch 50, a function generator 70 is placed to output a control signal. The function generator 70 outputs a square wave which repeatedly varies between a predetermined voltage and zero-voltage. When the voltage applied from the function generator 70 is lower than a gate preset voltage, the switch portion 51 is open. When the voltage applied from the function generator 70 is higher than a gate preset voltage, the switch portion 51 is closed.

Frequencies at which inverter surges repeatedly occur are about between 1 kHz and 20 kHz, for example. In order to simulate the situation, the function generator 70 applies, for example, a square wave of 10 kHz, so that the impulse voltage generated at the impulse voltage generation device 200 has a similar level of frequency.

In order to prevent damage to the power semiconductor switch 50 from overcurrent, the overcurrent protection circuit 100 is placed between the function generator 70 and the power semiconductor switch 50. A current detector 80 is placed at the earth side in the vicinity of the output terminal 68. The overcurrent protection circuit 100 accepts a current detection signal from the current detector 80 as an input.

Figure 2:
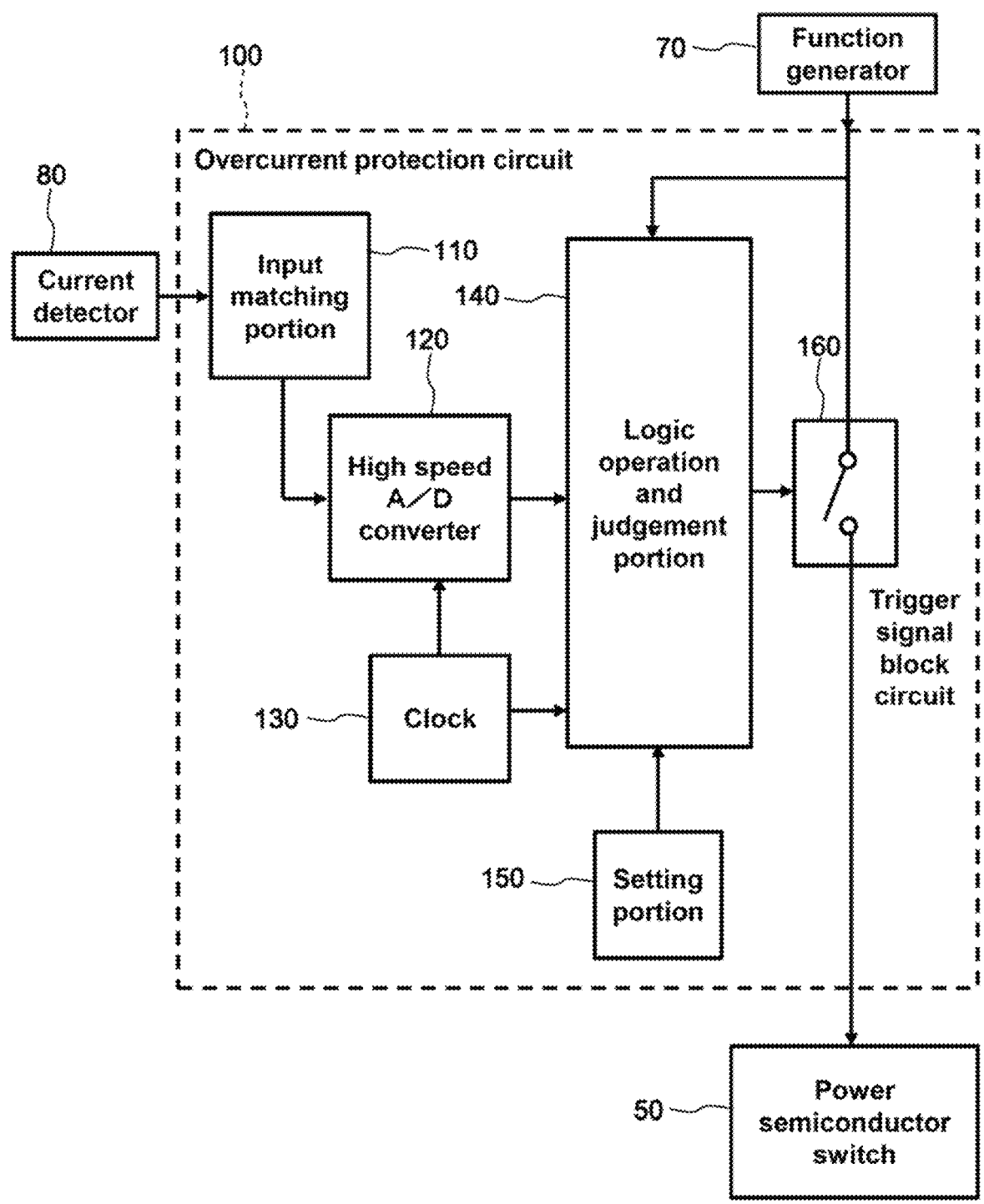
FIG. 2 is a block diagram showing the configuration of an overcurrent protection circuit in the impulse voltage generation device according to the first embodiment.

FIG. 2 is a block diagram showing the configuration of an overcurrent protection circuit in the impulse voltage generation device according to the first embodiment. The overcurrent protection circuit 100 includes an input matching portion 110, a high-speed A/D converter 120, a clock 130, a logic operation and judgment portion 140, a setting portion 150 and a trigger signal block circuit 160.

Figure 3:
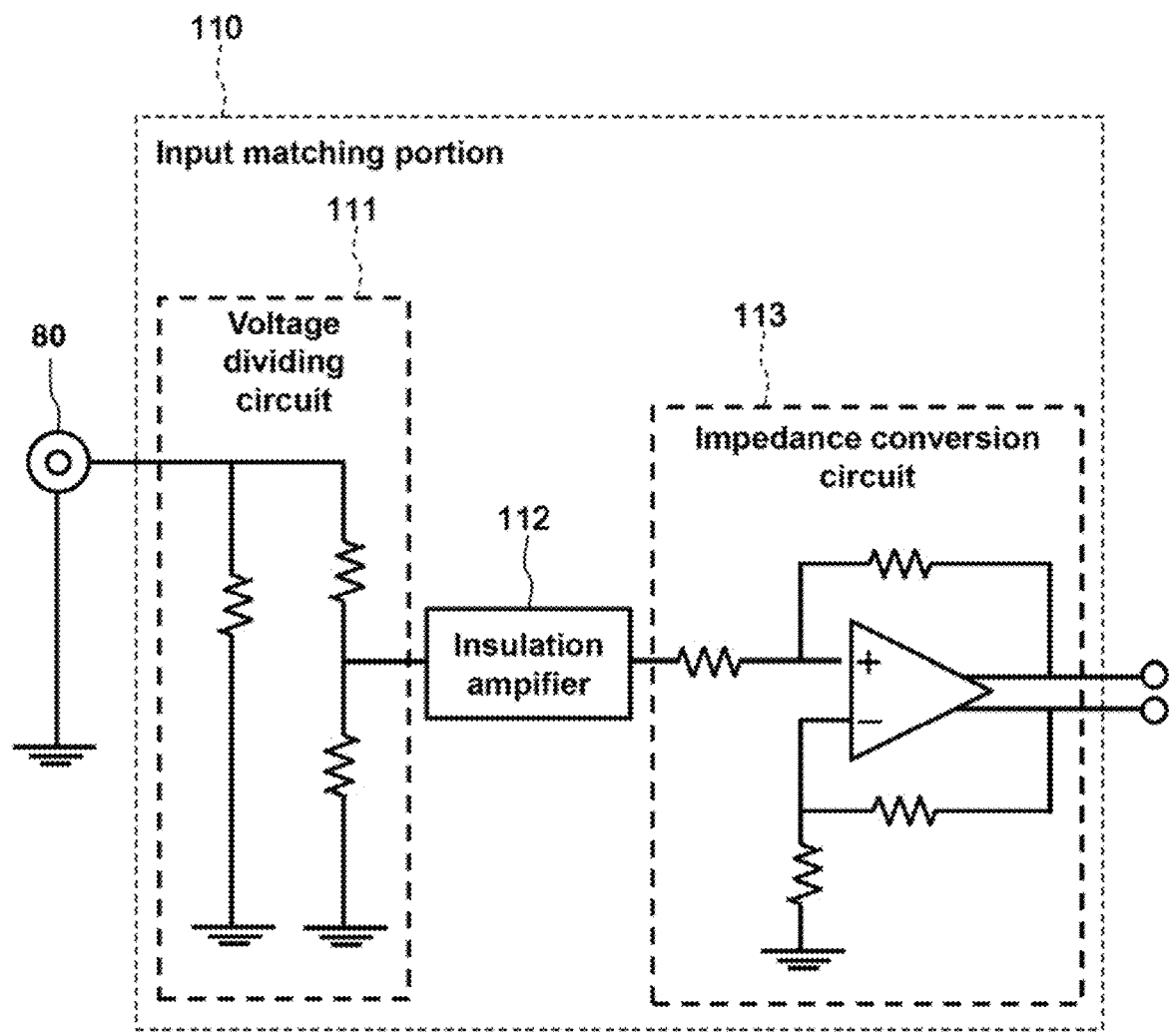
FIG. 3 is a conceptual circuit diagram showing the configuration of an input matching portion.

FIG. 3 is a conceptual circuit diagram showing the configuration of an input matching portion. The input matching portion 110 includes a voltage dividing circuit 111, an insulation amplifier 112, and an impedance conversion circuit 113. Depending on such a configuration, the input matching portion 110 provides impedance matching between the current detector 80 and the overcurrent protection circuit 100, as well as safety measures.

What is shown in FIG. 3 is an analogue circuit in order to make it easy-to-understand. However, the overcurrent protection circuit 100 shown in FIG. 2, including the input matching portion 110, is a digital processing circuit that runs at high speed. For example, the clock 130 is ticking at high speed, or 100 MHz for example. The high-speed A/D converter 120 conducts A/D conversion at a high speed of 100 MHz. The clock 130 also outputs time information at predetermined intervals.

The logic operation and the judgment portion 140 accepts the input signals such as: a digital value of a current signal by the high-speed A/D converter 120, a specified value for judgment from the setting portion 150, and a signal from the function generator 70. The logic operation and judgment portion 140 conducts logic operation in order to detect overcurrent and abnormalities, as well as to make a judgment. The logic operation and judgment portion 140 uses FPGA (Field Programmable Gate Array) or the like, for example.

When the logic operation and judgment portion 140 judges that there is overcurrent or abnormality, the trigger signal block circuit 160 responds to that judgment by blocking a gate voltage signal to be output from the function generator 70 to the power semiconductor switch 50. As a result, the gate voltage of the power semiconductor switch 50 falls below a gate preset voltage, thereby halting the generation of impulse voltage.

Figure 4:
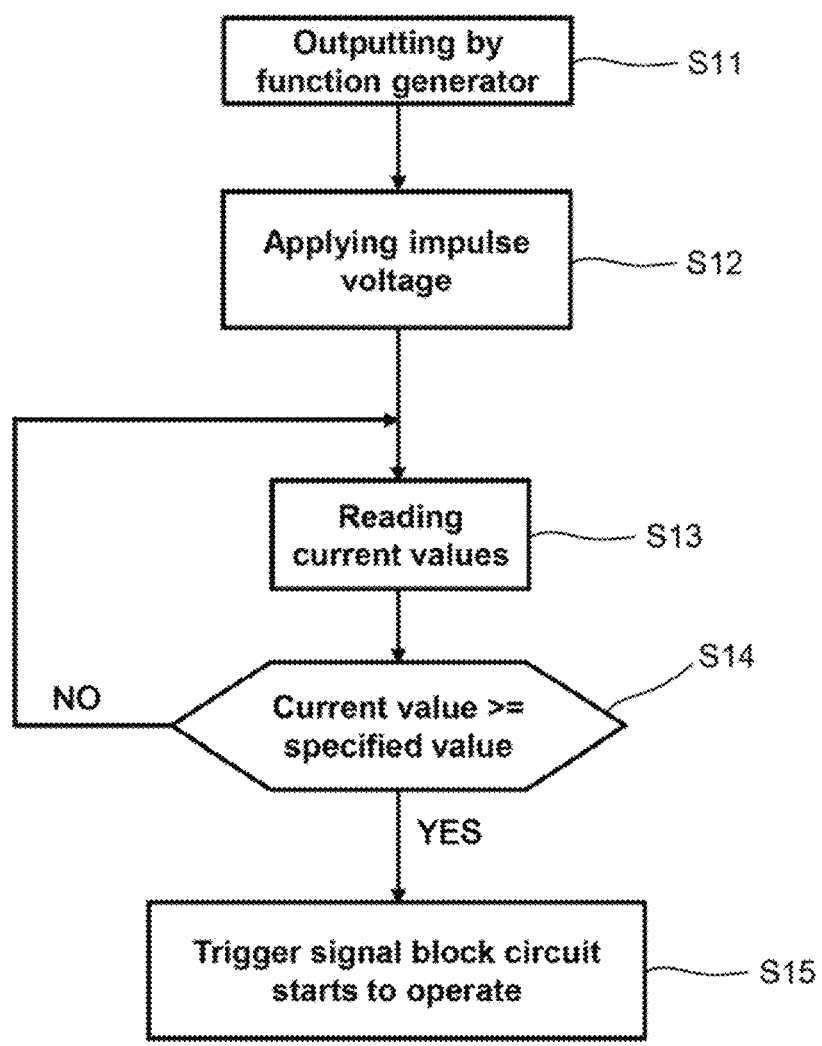
FIG. 4 is a flowchart showing the procedure of a power semiconductor switch protection method for the impulse voltage generation device according to the first embodiment.

FIG. 4 is a flowchart showing the procedure of a power semiconductor switch protection method for the impulse voltage generation device according to the first embodiment.

The function generator 70 outputs a gate voltage signal for the power semiconductor switch 50 (Step S11). Depending on the value of the gate voltage, the switch portion 51 of the power semiconductor switch 50 is opened or closed. When the switch portion 51 is open, the capacitor 40 is charged by voltage generated from the high voltage generator 10. When the switch portion 51 is closed, impulse voltage is applied to the load, which is a test target, via the output terminal 67 and 68, as electricity is discharged from the capacitor 40 (Step S12).

Following step S11, the logic operation and judgment portion 140 starts reading a current value (Step S13). The reading is conducted based on a sampling time set by the clock 130.

The logic operation and judgment portion 140 determines whether the current value that has been read out is greater than or equal to a specified value set by the setting portion 150 (Step S14). If the logic operation and judgment portion 140 judges the current value not to be greater than or equal to the specified value set by the setting portion 150 (Step S14, NO), step 13 and the following step are repeated.

Figure 5:
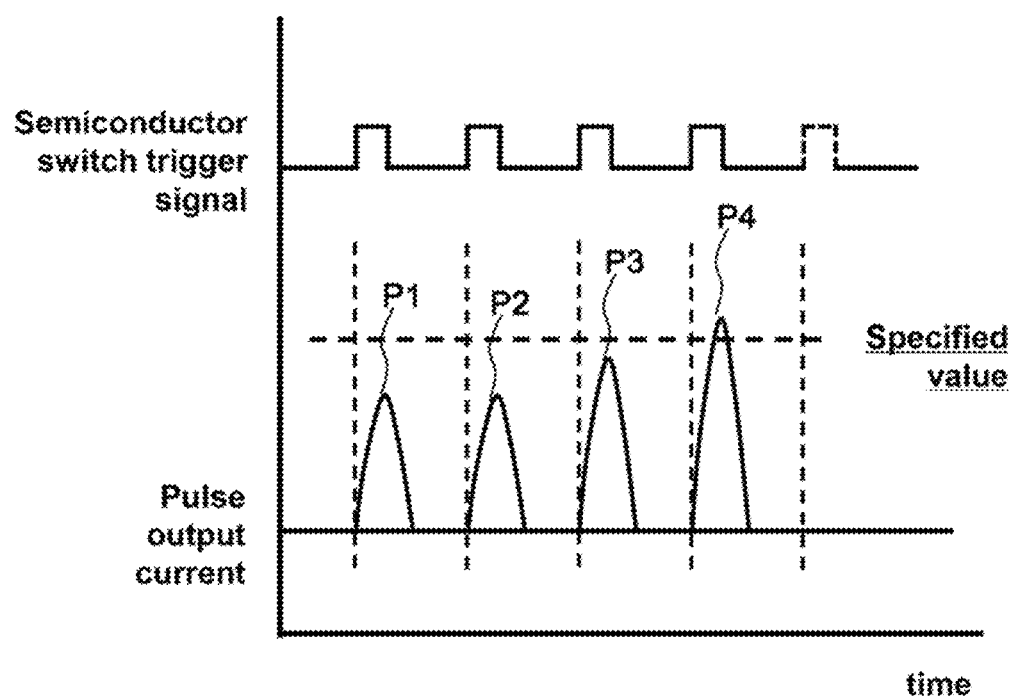
FIG. 5 is a time chart used to explain the power semiconductor switch protection method.

FIG. 5 is a time chart used to explain the power semiconductor switch protection method. In FIG. 5, a pulse output current is generated in response to a semiconductor switch trigger signal from the function generator 70. FIG. 5 shows the situation in which the level of the pulse output current level rises to P3 and then to P4.

As shown by the circuit in FIG. 1, high voltage from the output terminals 67 and 68 are attributed to discharging from the capacitor 40. It does not mean an increase in power source-side current in this state. Even if output current were to increase due to a declining insulation situation of, for example, a test target side that follows the output terminals 67 and 68, there are little expectations for protection associated with an increase in power-source side. There may be a case in which a power source-side overcurrent relay is operating. However, in such a case, it should be assumed that the soundness of the power semiconductor switch 50 is already impaired.

Accordingly, there is a current detector 80 on the output terminal side, which monitors current values here at high speed in order to help protect the power semiconductor switch 50. Details of the process will be described below.

When the current value reaches P4, the logic operation and judgment portion 140 determines that the current value is greater than or equal to the specified value set by the setting portion 150 (Step S14 YES).

After the logic operation and judgment portion 140 determines that the value is greater than or equal to the specified value, the trigger signal block circuit 160 starts to operate (Step S15). As a result, the application of impulse voltage comes to a halt.

Figure 6:
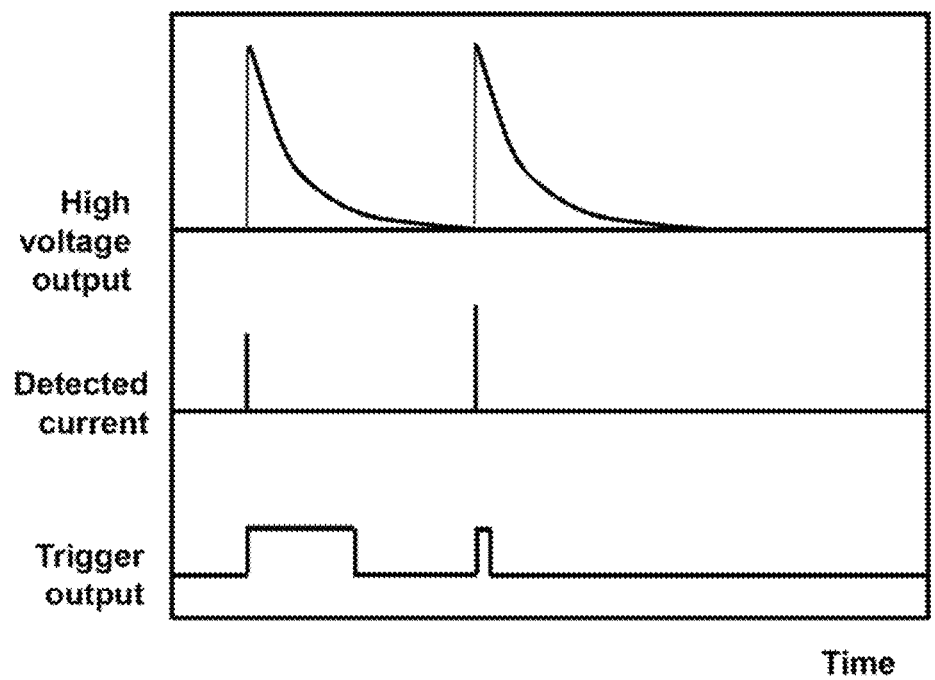
FIG. 6 is a graph used to explain changes over time in each portion at a time when overcurrent is detected.
Figure 7:
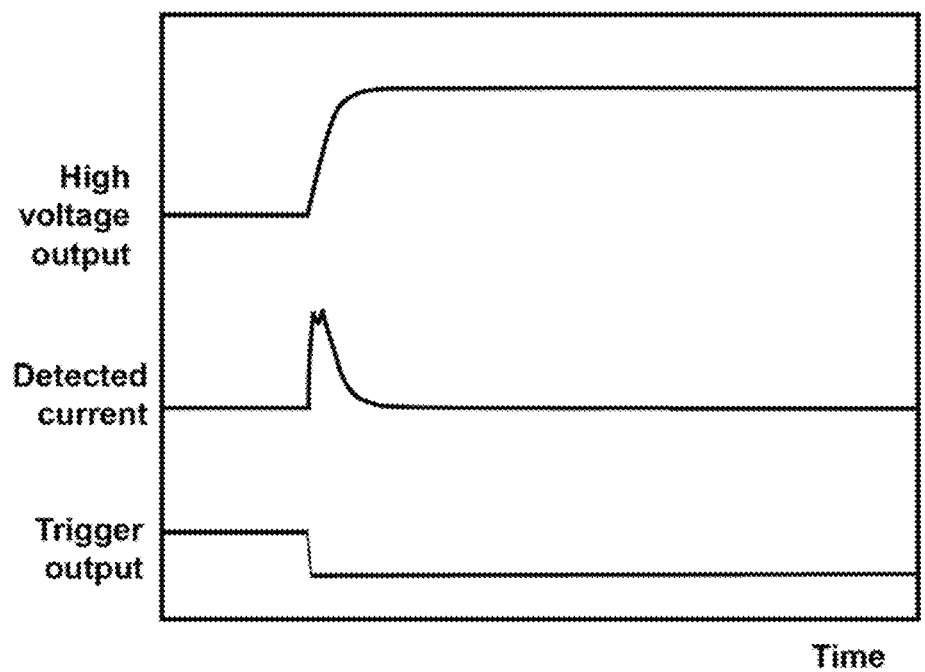
FIG. 7 shows a graph, which is the result of extending the one in FIG. 6 in time-axis direction, used to explain minute-time changes in each portion at a time when overcurrent is detected.

FIG. 6 is a graph used to explain changes over time in each portion at a time when overcurrent is detected. FIG. 7 shows a graph, which is the result of extending the one in FIG. 6 in time-axis direction, used to explain minute-time changes in each portion at a time when overcurrent is detected.

For example, assume that the frequency of trigger from the function generator 70 is 10 kHz, and sampling intervals of the clock 130 are 100 MHz. In this case, sampling is conducted $10^4$ times during one pulse cycle. Accordingly, as for the situation concerning the rising of impulse voltage, sampling can be effectively conducted nearly successively.

Therefore, at a certain impulse voltage, if it is judged that the detected current is exceeding the specified value, the generation of the next impulse is halted without fail. As a result, it is possible to prevent a situation leading to malfunctioning of the power semiconductor switch.

Second Embodiment

Figure 8:
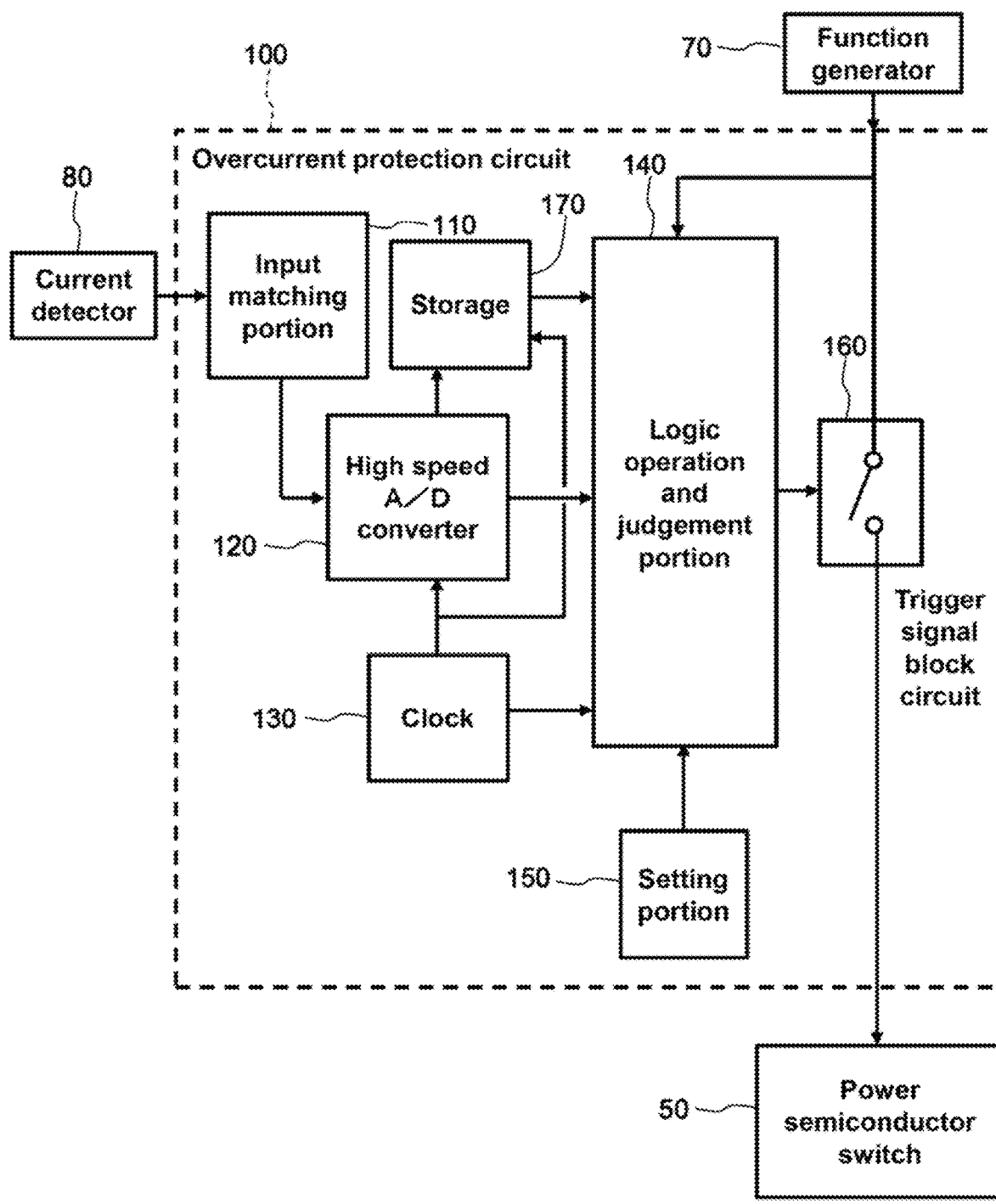
FIG. 8 is a block diagram showing the configuration of an overcurrent protection circuit in an impulse voltage generation device according to a second embodiment.

FIG. 8 is a block diagram showing the configuration of an overcurrent protection circuit in an impulse voltage generation device according to a second embodiment. The second embodiment is a variant of the first embodiment, with the overcurrent protection circuit 100 further including a storage 170.

Figure 9:
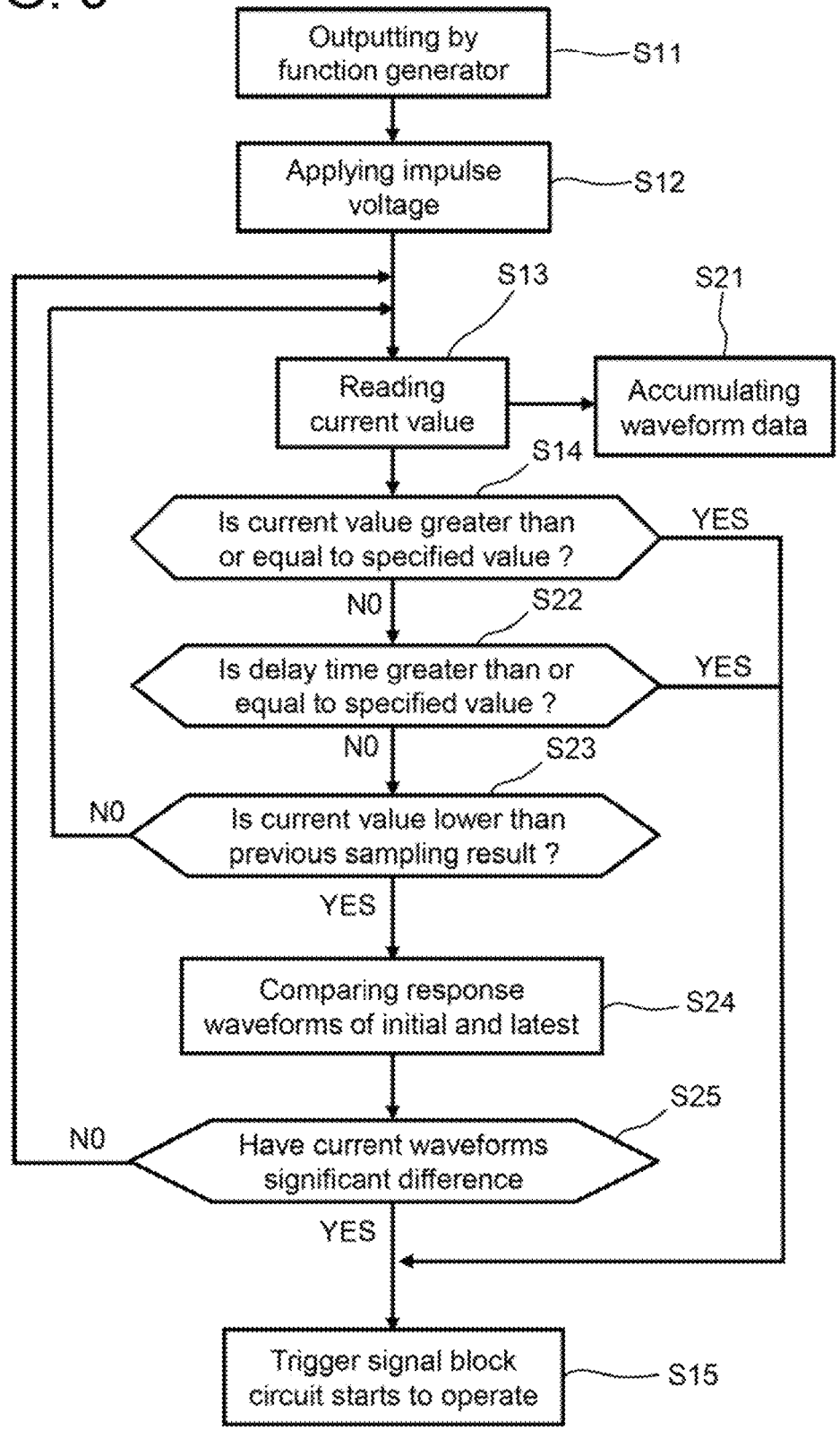
FIG. 9 is a flowchart showing the procedure of a power semiconductor switch protection method for an impulse voltage generation device according to the second embodiment.

FIG. 9 is a flowchart showing the procedure of a power semiconductor switch protection method for an impulse voltage generation device according to the second embodiment. According to the first embodiment, a judgment for current values is made at each sampling step. The second embodiment involves further judgments. Those added to the present embodiment will be described below.

A current signal that is accepted from the current detector 80 in each sampling cycle is A/D-converted by the high-speed A/D converter 120. Each time the conversion takes place, the storage 170 keeps the current value along with time information from the clock 130 and accumulate them as response waveform data.

If the logic operation and judgment portion 140 does not determine that the current value is greater than or equal to the specified value (Step S14 NO), the logic operation and judgment portion 140 then determines whether delay time DT is greater than or equal to a specified value (Step 22).

Figure 10:
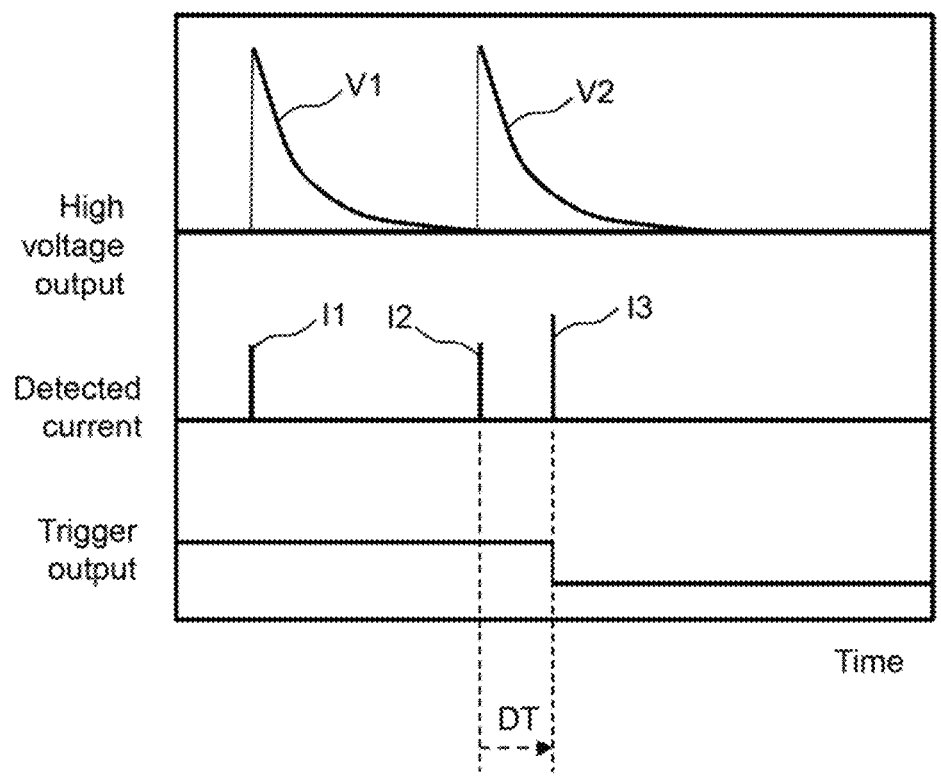
FIG. 10 is a graph showing an example of how a detection current is generated according to a power semiconductor switch protection method for an impulse voltage generation device of a second embodiment.

FIG. 10 is a graph showing an example of how a detection current is generated according to a power semiconductor switch protection method for an impulse voltage generation device of a second embodiment. High voltage V1 is output, and detection current I1 rises almost simultaneously. Similarly, high voltage V2 is output, and detection current I2 rises almost simultaneously.

However, as shown in FIG. 10, there may be a case in which when high voltage V2 is output, detection current I3 is obtained after a significant amount of delay time DT. It can be assumed that, with no direct output at this point in time, an abnormal current flows on the load side or test target side. The term "significant" means that this is not considered to have been induced directly from the value of delay time DT to high-voltage output.

If the logic operation and judgment portion 140 judges at step S22 that delay time DT is greater than or equal to a specified value (Step S22 YES), the trigger signal block circuit 160 starts to operate (Step S15), as shown in FIG. 9. As a result, the application of impulse voltage comes to a halt.

If the logic operation and judgment portion 140 does not judge at step S22 that delay time DT is greater than or equal to a specified value (Step S22 NO), the logic operation and judgment portion 140 then determines whether the current value is lower than the previous sampling result (Step S23). If the logic operation and judgment portion 140 judges that the current value is not lower than the previous sampling result (Step S23 NO), then step S13 and steps that follow are repeated.

If the logic operation and judgment portion 140 judges that the current value is lower than the previous sampling result (Step S23 YES), the logic operation and judgment portion 140 reads out the response waveform of the initial current and the response waveform of latest current from the storage 170 and compare the two (Step S24).

This process may involve using characteristic indicators in current waveforms, such as the time from a rising start point to an inflection point or the time leading up to a peak point, and comparing multidimensional vectors which have each indicator as factor. The logic operation and judgment portion 140 includes a waveform processing calculation portion designed to carry out such a waveform processing calculation.

The logic operation and judgment portion 140 determines whether the current waveforms have a significant difference (Step S25). The determination may be made by seeing if the absolute values of difference vectors of the above-mentioned multidimensional vectors are greater than a specified value. If the logic operation and judgment portion 140 determines that it cannot be said there is a significant difference (Step S25 NO), then step 13 and steps that follow are repeated.

If the logic operation and judgment portion 140 judges that there is a significant difference (Step S25 YES), the trigger signal block circuit 160 starts to operate (Step S15). As a result, the application of impulse voltage comes to a halt.

As described above, according to the present embodiment, protective operations are carried out not only for overcurrent during the application of voltage, but also in other situations, including when current is detected later than anticipated or when response waveforms change. This further ensures protection for the power semiconductor switch.

Other Embodiments

While the embodiments of the present invention have been described, the embodiments have been presented by way of example only, and are not intended to limit the scope of the invention.

Further, the embodiments may be conducted in other various forms, and various omissions, replacements, and modification can be done without departing from the gist of the invention.

The embodiments or their variation are included in the scope or the gist of the invention and also included in the scope recited in the claims and their equivalents.

The invention claimed is:

1. An impulse voltage generation device designed to output impulse voltage from an output terminal in order to repeatedly perform a set of applying process of impulse voltage to a test target at a predetermined application interval and non-applying process of impulse voltage to the test target at a predetermined non-application interval, the device comprising:
an input DC power source to supply DC power;
a high voltage generator to generate DC voltage higher than voltage of the input DC power source;
a capacitor that is disposed in parallel to the high voltage generator and can be charged to a high voltage state;
a power semiconductor switch that is placed at an output side of the high voltage generator and in series to the high voltage generator and is designed to shut off or allow electricity output from the high voltage generator;
a function generator to output, to a gate portion of the power semiconductor switch, square wave of impulse voltage to be applied to the test target, the impulse voltage having similar level of frequency with a frequency of the impulse voltage to the test target at the predetermined application interval;
a current detector to detect output current at the output terminal; and
an overcurrent protection circuit that is configured to conduct analog-to-digital conversion at sampling intervals sufficiently shorter than the predetermined application interval when receiving a current signal from the current detector, monitor values of the output current, and block output from the function generator to the power semiconductor switch if it is determined that there is an abnormality, wherein
the overcurrent protection circuit includes:
a high-speed A/D converter to A/D-convert the current signal from the current detector at shorter intervals than those for application of the impulse voltage,
a logic operation and judgment portion to receive a digitalized current signal from the high-speed A/D converter, to perform first determination whether the digitalized current signal has exceeded a specified value or not, and to output a notice of the judgement as the abnormality, if it is judged that the digitalized current signal has exceeded the specified value at the first determination, wherein the logic operation and judgment portion is configured to perform second determination whether a current waveform has changed, by making comparisons of the current waveform with an initial current waveform, if it is judged that the digitalized current signal has not exceeded the specified value at the first determination, and to output the notice of the judgement as the abnormality,
a trigger signal block circuit to block an output from the function generator to the power semiconductor switch after receiving the notice of judgement from the logic operation and judgment portion, and
a storage to receive the digitalized current signal from the high-speed A/D converter, and to accumulate the current waveform with time information.

2. The impulse voltage generation device according to claim 1, wherein
the logic operation and judgment portion includes a portion designed to determine whether a delay of the current detected at the current detector with respect to a current when high voltage is output is greater than or equal to a specified value.

3. The impulse voltage generation device according to claim 1, wherein
the overcurrent protection circuit further includes an input matching portion to carry out impedance matching with the current detector side.

4. The impulse voltage generation device according to claim 1, wherein
the overcurrent protection circuit further includes a clock to specify, sampling intervals for the high-speed A/D converter.

5. A method for protecting a power semiconductor switch that repeatedly performs a set of applying process of impulse voltage to a test target at a predetermined application interval and non-applying process of impulse voltage to the test target at a predetermined non-application interval, the method comprising:
  causing an impulse voltage to be applied to a test target due to an output from a function generator;
  reading a current value;
  determining whether a current value that is read is greater than or equal to a specified value, and, if the current value is not greater than or equal to the specified value, conducting the current value reading step and subsequent processes repeatedly;
  triggering a first block process if the current value that is read is determined to be greater than or equal to the specified value;
  comparing a current response waveform read from a storage with an initial current response waveform which has been read, if the current value is not greater than or equal to the specified value and if the current value is lower than previous sampling result within a predetermined time;
  determining whether there is a significant difference as a result of the comparison, and, if there is no significant difference, repeating the current value reading and subsequent processes; and
  triggering a second block process if it is determined that there is a significant difference.

6. The power semiconductor switch protection method according to claim 5, further comprising:
  determining, after the determination of the current value and before the response waveform comparison, whether a current generation delay time is greater than or equal to a specified value; wherein
  the second block process is triggered if it is determined that the current generation delay time is greater than or equal to the specified value.

7. The impulse voltage generation device according to claim 1, wherein
  the logic operation and judgment portion is configured to determine at the second determination that the current waveform has changed, if there is a significant difference as a result of the comparison.

8. The impulse voltage generation device according to claim 5, wherein
  the logic operation and judgment portion is configured to determine at the second determination that the current waveform has changed, if absolute values of difference vectors of multidimensional vectors are greater than a specified value as the significant difference, the multidimensional vectors including at least one of time from a rising start point to an inflection point of the waveform and time from the rising start point to a peak point of the waveform.

9. An impulse voltage generation device comprising,
  an input DC power source to supply DC power;
  a high voltage generator to generate DC voltage higher than voltage of the input DC power source;
  a capacitor that is disposed in parallel to the high voltage generator;
  a power semiconductor switch that is placed at an output side of the high voltage generator and in series to the high voltage generator, to shut off or allow electricity output from the high voltage generator;
  a function generator to output, to a gate portion of the power semiconductor switch, square wave of a first impulse voltage to be applied to a test target, the first impulse voltage having similar level of frequency with a frequency of a second impulse voltage to the test target, the second impulse voltage being output from an output terminal in order to repeatedly perform a set of applying process of impulse voltage to the test target at a predetermined application interval and non-applying process of impulse voltage to the test target at a predetermined non-application interval;
  a memory to store information of waveform at sampling time; and
  circuitry configured to
  monitor a value of output current at the output terminal, after applying the first impulse voltage to the test target,
  perform a first determination whether the value of output current at the output terminal has exceeded a specified value or not,
  perform a second determination whether a current waveform has changed, by making comparisons of the current waveform with an initial current waveform, under a condition that the value of output current at the output terminal has not exceeded the specified value at the first determination,
  block output from the function generator to the power semiconductor switch as abnormal state, under a condition that the value of output current at the output terminal has exceeded the specified value at the first determination, or under a condition that the current waveform has changed at the second determination.

10. The impulse voltage generation device according to claim 9, wherein
  the circuitry is further configured to determine whether a delay of the output current with respect to a current when high voltage is output is greater than or equal to a specified value.

11. The impulse voltage generation device according to claim 9, wherein
  the circuitry is further configured to carry out impedance matching with a current detector that is arranged at the output terminal to detect the output current.

12. The impulse voltage generation device according to claim 11, wherein
  the circuitry is further configured to specify sampling intervals for a high-speed A/D converter which A/D-converts a current signal from the current detector at shorter intervals than those for the predetermined application of the impulse voltage.

13. The impulse voltage generation device according to claim 9, wherein
  the circuitry is configured to determine at the second determination that the current waveform has changed, if there is a significant difference as a result of the comparison.

14. The impulse voltage generation device according to claim 13, wherein
  the circuitry is configured to determine at the second determination that the current waveform has changed, if absolute values of difference vectors of multidimensional vectors are greater than a specified value as the significant difference, the multidimensional vectors including at least one of time from a rising start point to an inflection point of the waveform and time from the rising start point to a peak point of the waveform.

* * * * *